(12) United States Patent
Egolf

(10) Patent No.: US 6,292,073 B1
(45) Date of Patent: Sep. 18, 2001

(54) SOLDERLESS CIRCUIT INTERCONNECT HAVING A SPRING CONTACT PASSING THROUGH AN APERTURE

(75) Inventor: Stephen P. Egolf, Somerset, PA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/184,462

(22) Filed: Oct. 26, 1998

(51) Int. Cl.⁷ ....................................................... H01P 1/04
(52) U.S. Cl. ............................ 333/260; 361/787; 361/789
(58) Field of Search ..................................... 333/260, 246; 361/787, 789

(56) References Cited

U.S. PATENT DOCUMENTS

| | | | |
|---|---|---|---|
| 3,795,884 | * | 3/1974 | Kotaka .............................. 361/787 X |
| 4,509,099 | * | 4/1985 | Takamatsu et al. .................. 361/789 |
| 4,816,791 | * | 3/1989 | Carnahan et al. ............... 333/260 X |
| 5,495,395 | * | 2/1996 | Yoneda et al. .................... 361/787 X |
| 5,552,752 | * | 9/1996 | Stardivant et al. .............. 333/246 X |
| 5,675,302 | * | 10/1997 | Howard et al. .................... 333/260 X |
| 5,886,590 | * | 3/1999 | Quan et al. ....................... 333/260 X |
| 6,028,498 | * | 2/2000 | Bickford ............................... 333/260 |

FOREIGN PATENT DOCUMENTS

4291501 * 10/1992 (JP) ..................................... 333/260

* cited by examiner

Primary Examiner—Benny Lee
(74) Attorney, Agent, or Firm—Thomas C. Stover

(57) ABSTRACT

A spring acts as a central conductor of a fifty ohm RF coax connector, while an aluminum backing of a microstrip module has a hole coaxially surrounding the spring. The resulting annular hole in the aluminum backing represents the outer coax conductor and the initial portion of a stripline circuit board. The machining of the aluminum backing creates a continuous ground path through the transition, thereby reducing the effects of radiation loss, and the need is fulfilled for a low loss, broadband RF solderless interconnect for solid-state systems requiring the quick removal and replacement of microstrip or stripline circuits.

11 Claims, 1 Drawing Sheet

SOLDERLESS CIRCUIT INTERCONNECT HAVING A SPRING CONTACT PASSING THROUGH AN APERTURE

STATEMENT OF GOVERNMENT INTEREST

The invention described herein may be manufactured and used by or for the Government for governmental purposes without the payment of any royalty thereon.

BACKGROUND OF THE INVENTION

Field of the Invention

This invention relates to a circuit connection, particularly a solderless circuit interconnect.

The present invention relates to the field of radio frequency (RF) connectors. Prior art solderless methods used to connect microstrip substrates to stripline circuits include the use of clips which are used as a connection between pins on each circuit. Another known method includes the use of spring fingers soldered to the stripline circuit which makes contact with a pad etched on the transition piece epoxy board which is soldered to the microstrip substrate. Both of these methods provide undesirable narrow band transmissivities and tend to have more insertion loss than wanted, due to radiation.

SUMMARY OF THE INVENTION

The need for a low loss, broadband RF solderless interconnect for solid-state systems which require the quick removal and replacement of microstrip or stripline circuits is filled by the present invention.

The preferred design has a much better continuous fifty ohm path than the aforesaid spring finger method together with better grounding, which allows for lower loss and wideband performance. A spring bellows acts both as a central conductor of a fifty ohm coax and a connector contact member, while an aluminum backing of the microstrip module has a hole coaxially surrounding, the spring bellows. The annular hole in the aluminum backing acts as the outer coax conductor and the initial portion of the stripline circuit board. The machining of the aluminum backing creates a continuous ground path through the transition, thereby reducing the effects of radiation loss.

BRIEF DESCRIPTION OF THE DRAWINGS

The invention will become more apparent from the following detailed specification and drawing in which.

DETAILED DESCRIPTION OF THE INVENTION

Figure 1:
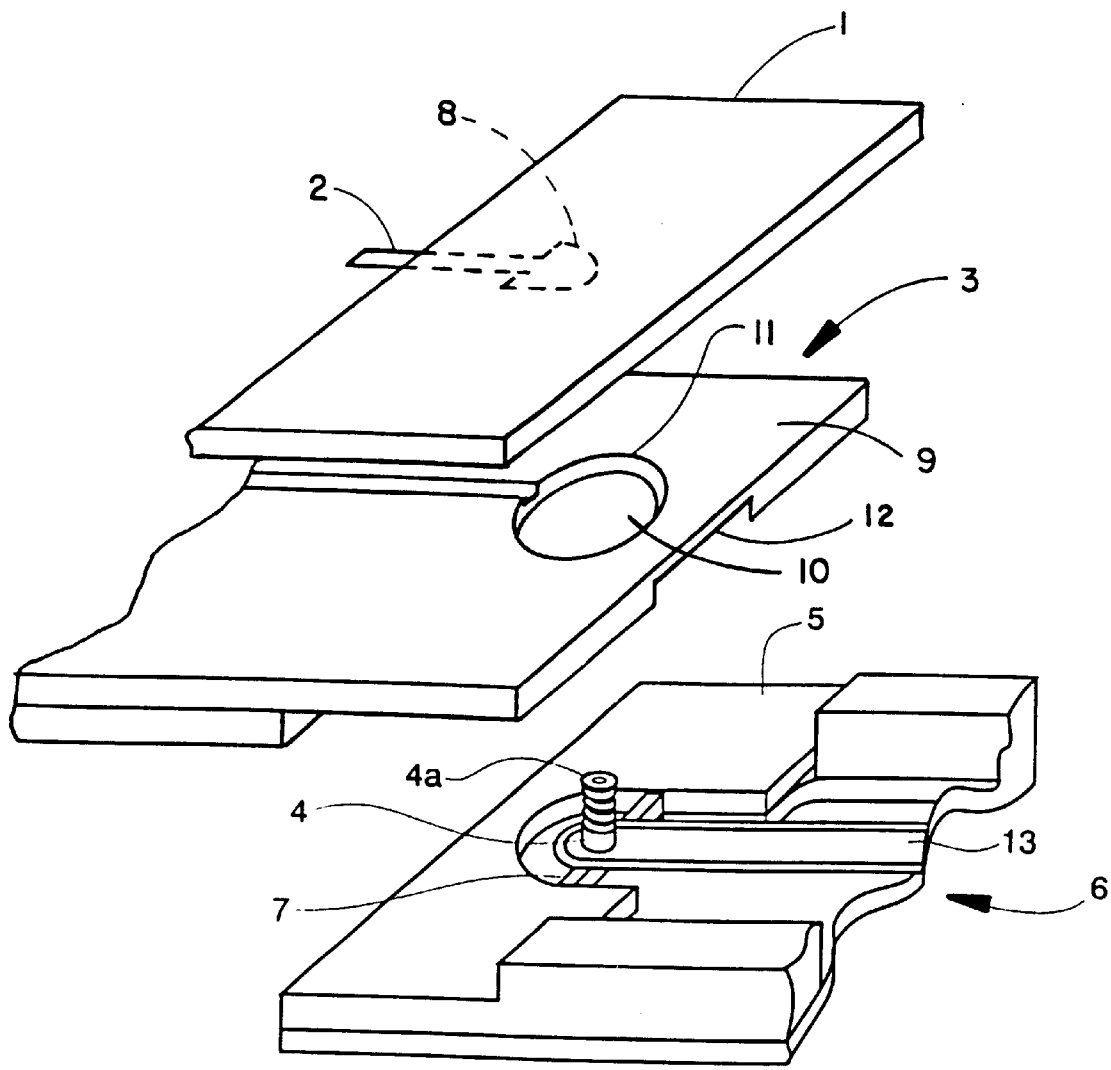
FIG. 1 is an isometric fragmentary schematic exploded view of the spring biased circuit interconnect of the present invention.

In accordance with a preferred embodiment of the invention, the exploded figure discloses an upper microstrip module board 3 having an epoxy board nonconductive plate member 1 affixed thereto by fastening means such as screws, not shown. Plate member 1 bears contact pad 8 upon its lower surface, connected to conductive ribbon 2, in turn soldered to the microstrip module 3, which is typically a power amplifier module. Thin aluminum backing layer 9 of circuit board 3 has a hole 10 formed therein, aligned with contact pad 8 and having a diameter greater than the thickness of the conductive layer, as shown. The annular conductive aluminum surface portion 11 of hole 10 forms the outer coaxial conductor of the coaxial interconnect member. Also, a slot 12 is formed within aluminum layer 9, and functions as the top ground plane of strip member 13 of stripline circuit board 6.

Conductive strip member 13 of lower circuit board 6 is joined with the inner helical spring bellows member 4 which comprises an inner coaxial contact member. Note that annular conductive wall portion of the hole 11 coaxially surrounds inner coaxial spring contact member 4, comprising a helical spring, which could be conical, and includes a top contact member 4a for bearing against contact pad 8, upon assembly of the components. The longitudinal spring axis is perpendicular to major surface portions of the aluminum backing sheet 9. After upper plate 1 and the two circuit boards 3 and 6 are brought together, inner coaxial spring bellows member 4 is placed in compression so as to mechanically bias the spring member in contact with the pad 8 for good electrical contact. Chassis member 5 comprises the lower ground plane of strip member 13 of the lower stripeline circuit board 6, which is usually an RF splitter or combiner known to those skilled in the art. Support block member 7 of circuit board 6 comprises a spacer.

The described design has a much better continuous fifty ohm path than the aforesaid prior art spring finger method, and better grounding, which allows for lower loss and wideband performance. The spring bellows 4 acts as a central conductor of a fifty ohm coax while the aluminum backing layer 9 of the microstrip module represents the outer conductor and the initial portion of the stripline circuit board. The machining of the aluminum backing creates a continuous ground path through the transition, thereby reducing the effects of radiation loss.

Comparative testing of the present invention was performed and demonstrated a substantial reduction in insertion loss over the range of DC up to 5.5 GHz, relative to the aforesaid spring finger method of the prior art. The insertion loss improvement of an embodiment of the invention relative to the spring finger method was 400% (1–2 GHz); 500% (2–3 GHz); and over 700% for the 3–4 GHz range.

While preferred embodiments of the invention have been disclosed, others will become apparent to the skilled worker in the art reading the description and thus the scope of the invention is to be limited solely by the terms of the claims and art recognized equivalents thereof.

What is claimed is:

1. An electrical assembly having a solderless interconnect comprising,
   (a) a first electrical circuit component for conducting a radio frequency signal therethrough;
   (b) a second electrical circuit component for conducting the radio frequency signal therethrough;
   (c) an electrically conductive member positioned between said first and second circuit components and having an aperture therethrough under an electrical contact element of the first circuit component, said aperture having a major dimension greater than the thickness of said electrically conductive member and
   (d) a conductive spring member electrically connected to the second circuit component at a position so as to be coaxially surrounded by said aperture which spring member is mechanically biased against said electrical contact element of the first circuit component due to compression of said spring member, upon mechanically fastening the first and second circuit components together.

2. The assembly of claim 1 wherein the electrically conductive member of paragraph (c) is a thin conductive sheet.

3. The assembly of claim 2 wherein said conductive spring member is a helical spring having a longitudinal axis substantially perpendicular to major surface portions of said thin conductive sheet.

4. The assembly of claim 1 wherein said conductive spring member comprises a helical spring.

5. An electrical assembly having a solderless interconnect comprising,
   (a) a first generally planar electrical circuit component for conducting a radio frequency signal therethrough;
   (b) a second generally planar electrical circuit component for conducting the radio frequency signal therethrough;
   (c) an electrically conductive generally planar member positioned between said first and second circuit components and having an aperture therethrough under an electrical contact element of the first circuit component, said aperture having a major dimension greater than the thickness of said electrically conductive member and
   (d) a conductive spring member electrically connected to and protruding from the second circuit component at a position so as to be coaxially surrounded by said aperture and which spring member is mechanically biased against said contact member of the first circuit component due to compression of said spring member, upon mechanically fastening the first and second circuit components together.

6. The assembly of claim 5 wherein the planar member recited in paragraph (c) is a thin conductive sheet.

7. The assembly of claim 6 wherein said conductive spring member is a helical spring having a longitudinal axis substantially perpendicular to major surface portions of said thin conductive sheet.

8. The assembly of claim 5 wherein said conductive spring member comprises a helical spring.

9. An electrical assembly having a solderless interconnect comprising,
   (a) a microstrip module board for conducting a radio frequency signal therethrough;
   (b) a stripline module board for conducting the radio frequency signal therethrough;
   (c) a thin conductive backing layer of said microstrip module positioned between said first and second module boards and having an aperture therethrough under an electric contact of said microstrip module board and
   (d) a conductive spring member electrically connected to said stripline module board and projecting through said aperture so as to be coaxially surrounded thereby, said spring member is mechanically biased against said contact due to compression of said spring, member, upon mechanically fastening the first and second module boards together.

10. The assembly of claim 9 wherein said conductive spring member is a spring bellows.

11. The assembly of claim 9 wherein said conductive spring member is a helical spring having a longitudinal axis substantially perpendicular to major surface portions of said thin conductive backing layer.

* * * * *